(12) United States Patent
Andreas

(10) Patent No.: US 6,358,325 B1
(45) Date of Patent: Mar. 19, 2002

(54) POLYSILICON-SILICON DIOXIDE CLEANING PROCESS PERFORMED IN AN INTEGRATED CLEANER WITH SCRUBBER

(75) Inventor: Michael T. Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/468,022

(22) Filed: Dec. 20, 1999

Related U.S. Application Data (63) Continuation-in-part of application No. 08/916,834, filed on Aug. 22, 1997, now abandoned.

(51) Int. Cl.⁷ .............................. B08B 1/00; B08B 1/02; B08B 3/08; C23G 1/02; C23G 1/14
(52) U.S. Cl. ................ 134/2; 134/3; 134/6; 134/26; 134/30; 134/32; 134/902; 15/77
(58) Field of Search .................... 134/2, 3, 6, 26, 134/30, 902; 15/77

(56) References Cited

U.S. PATENT DOCUMENTS

| | | | |
|---|---|---|---|
| 3,691,582 A | 9/1972 | Call | 15/77 |
| 3,970,471 A | 7/1976 | Bankes et al. | 134/6 |
| 4,281,031 A | 7/1981 | Hillman et al. | 427/45.1 |
| 5,081,733 A | 1/1992 | Kudo | 15/77 |
| 5,357,645 A | 10/1994 | Onodera | 15/97.1 |
| 5,772,784 A | 6/1998 | Mohindra et al. | 134/21 |
| 5,789,360 A | 8/1998 | Song et al. | 134/3 |
| 5,873,381 A | 2/1999 | Han | 134/902 |

OTHER PUBLICATIONS

Peter Van Zant, Microchip Fabrication, 3rd edition, pp. 72–89, pp 590, 1997.
Badih El–Kareh, Fundamentals of Semiconductor Processing Technologies, pp. 264–265, 1995.

*Primary Examiner*—Zeinab El-Arini
(74) *Attorney, Agent, or Firm*—Workman, Nydegger & Seeley (57) ABSTRACT

An integrated cleaner with scrubber for cleaning and scrubbing semiconductor substrates that includes a housing that contains both a cleaning module and a scrubbing module. The cleaning module is capable of performing a wet-cleaning process on a batch of the semiconductor substrates. The cleaning module comprises a cleaning tank in which a batch of semiconductor substrates are cleaned. A megasonic device can be attached to the cleaning tank to enhance cleaning. The scrubbing module includes a plurality of scrubbers each of which scrubs a semiconductor substrate. The integrated cleaner with scrubber also comprises a robot for moving the semiconductor substrates between the cleaning and scrubbing modules. The inventive machine and process allows the cleaning and scrubbing of semiconductor substrates without removal from the housing while maintaining as static the surface chemistry of the semiconductor substrates, as well as the ambient humidity, the ambient temperature, and the ambient particle contamination within the housing. A drying module may also be included and made integral with in the housing to dry the semiconductor substrates.

52 Claims, 4 Drawing Sheets

POLYSILICON-SILICON DIOXIDE CLEANING PROCESS PERFORMED IN AN INTEGRATED CLEANER WITH SCRUBBER

RELATED APPLICATIONS

This is a continuation-in-part of U.S. patent application Ser. No. 08/916,834, filed on Aug. 22, 1997, titled INTEGRATED CLEANER WITH SCRUBBER AND METHOD OF USE, now abandoned, which is incorporated herein by reference.

BACKGROUND OF THE INVENTION

1. The Field of the Invention

The present invention relates to an apparatus and methods for using the same in the fabrication of an integrated circuit, and particularly an apparatus for performing both a cleaning process and a scrubbing process upon a semiconductor substrate utilizing one machine that integrates the cleaning and scrubbing processes in the fabrication of an integrated circuit situated on a semiconductor substrate.

2. The Relevant Technology

In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

Producing a substantially impurity free semiconductor substrate is an ongoing challenge during fabrication of operable integrated circuits and other microelectronic devices. During fabrication, several operations are completed with that require a thorough cleaning of the semiconductor substrate prior to any further processing.

Processes used to remove impurities from a semiconductor substrate include etching, cleaning, and scrubbing. A scrubber can be used after an abrasive operation such as a polishing process. Such abrasive operations can be mechanical or chemical mechanical. For example, after a chemical mechanical planarization (CMP) process has been completed, one or more contaminates can remain on a surface of a semiconductor substrate that was subjected to the CMP process. In this situation the contaminate is typically not completely removed with a wet-cleaning process alone. The extra cleaning power of a physical cleaner is needed. Scrubbers such as brush scrubbers are used to provide the needed physical cleaning action. The brush scrubber is not, however, used immediately after every CMP process. There are times when an intermediate cleaning step is utilized. One cleaning process that is regularly done prior to the scrubber cleaning process is some type of a cleaning process such as a wet-cleaning process.

A wet-cleaning process is particularly useful after semiconductor substrates have been processed on a polishing tool. A wet-cleaning process is needed between the CMP process and the scrubber because if the semiconductor substrates go from the polishers to the scrubbers, the scrubber tends to get loaded with polishing residuals. The polishing residuals are typically in the form of a slurry or abrasive media combined with particles from the portion of the semiconductor substrate that was removed by the polisher. A cleaning process such as a wet-clean process can remove a large portion of the polishing residue.

Current technology requires two separated work stations and machines for the cleaning process and the scrubber process. A semiconductor substrate must currently be loaded and unloaded for each of the two separated machines and be transferred therebetween. With each transfer of the semiconductor substrate between various machines used during fabrication, the possibility of contamination increases and with that, also the likelihood of lower process yield. As such, it would be advantageous to control the surface chemistry, the ambient humidity, the temperature, and the ambient particle contamination between the cleaning process and the scrubber process.

By way of example, a semiconductor substrate may have situated thereon a mixed interface of hydrophobic and hydrophilic material on a surface thereof. A batch of the semiconductor substrates is to be first processed in a wet cleaning machine and then processed in a scrubber machine that is proximally close yet separated from the wet cleaning machine. The separation of machines may, during transportation of the semiconductor substrates therebetween, cause some oxidizing or localized air drying of regions of hydrophobicity on the semiconductor substrates that can cause problems later on. Also, if the semiconductor substrates have a polishing residue thereon that, once dried will not scrub off, a nucleation site can develop that may later reduce fabrication yields and increase device failures. Extra precautionary measures are desirable in the fabrication process to try to reduce the potential contamination caused by the transfer of the semiconductor substrate between various separated machines. Such measures tend to reduce throughput.

Fabrication processes performed upon semiconductor substrates must be done in a tightly controlled environment, typically referred to as a clean room. Because of the closely controlled environment of a clean room and the expense and equipment required to maintain the conditions of the clean room, floor space is very valuable. At the same time, however, the increasing number of processes and innovations that require new or additional machines are competing for valuable space in the clean room.

Figure 5:
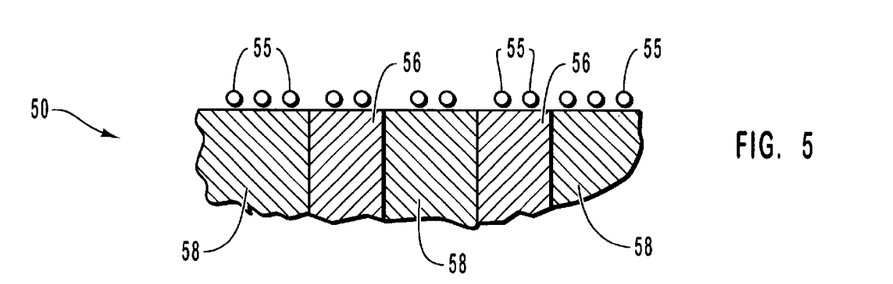
FIG. 5 is a view of FIG. 4 after a CMP process that exposes an interface of polysilicon and silicon dioxide, where slurry particles are situated upon the exposed interface.
Figure 7:
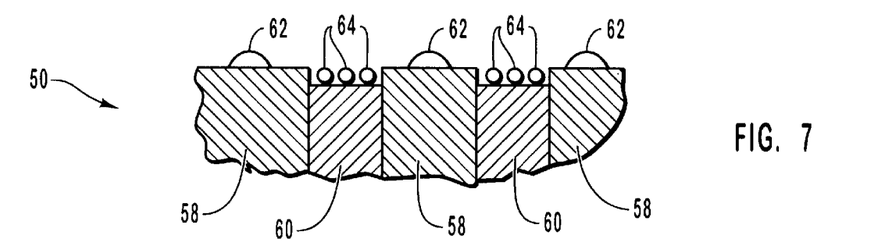
FIG. 7 is a view of FIG. 6 after a cleaning operation that removes the residuai of the slurry particles as well as the oxidized portion of the exposed polysilicon, but leaves a cleaning solution used in the cleaning operation, where the cleaning solution does not wet the exposed surface of the hydrophobic polysilicon but does wet the exposed surface of the hydrophilic silicon dioxide.

As seen in FIG. 5, an exposed interface of silicon dioxide 54 and polysilicon 56 on a semiconductor substrate 50 was formed using a CMP machine. The CMP machine would leave slurry particles 55 as seen in FIG. 5 upon the exposed interface. Semiconductor substrate 50 would then be moved to a different machine that would perform a scrubbing process upon semiconductor substrate 50. The scrubbing process would remove slurry particles 55 as seen in FIG. 5, but would leave a cleaning solution droplets 62, 64 as seen in FIG. 7 upon the exposed interface. While cleaning solution droplets 64 are upon the hydrophobic polysilicon 60 and tend to bead up due to high surface tension, cleaning solution droplets 62 are upon the hydrophilic silicon dioxide 58 and tend to spread out due to the lower surface tension.

After the scrubbing machine, semiconductor substrate 50 would again be moved to a spin-dry machine, separate from the scrubbing machine, that would perform a drying process. The drying machine spins whiling drying semiconductor substrate 50. This process typically leaves water spots on the hydrophobic exposed surface of polysilicon 58. These water spots result in an oxidation of the polysilicon, leaving oxide 61. Oxide 61 causes problems in later processing, where an electrically conductive material is deposited over polysilicon 58 upon oxide 61. The oxidized portion 61 of polysilicon 58 causes an increase in resistivity between polysilicon 58 and the electrically conductive material thereover, leading to improper device performance and other defect-related reduction in performance characteristics.

Alternately, prior art processes have also oxidized an exposed surface of polysilicon of an exposed interface of silicon dioxide and polysilicon before the semiconductor substrate was dry or otherwise subjected to a drying process. The oxidation of the exposed polysilicon occurred either during the brush scrubbing process or could also occur even before the brush scrubbing process. Thereafter, the oxidized portion of the exposed polysilicon surface would be removed in a high-pH solution, such a solution of ammonium hydroxide and peroxide. This oxide removal process tended to also etch the polysilicon while still leaving a thin oxide on the polysilicon. Next, the wafer was dried in a spin rinse and dry process in which the oxide layer still remained and had not yet been removed. Consequently, a still further hydrofluoric acid etchant would be needed to remove the oxidation from the polysilicon.

As noted above, prior art processes moved the semiconductor wafer across distanced between multiple tools. Tools that integrated various processes have been suggested nor taught the combined tools of brush scrubbing with spin rinse drying. This present state of the art in such an integrated tool is known to cause water spots on hydrophobic surfaces such as polysilicon, and thus oxidation thereof What is needed is a method of performing a cleaning process and a scrubbing process in such a way as to substantially eliminate contamination incident to semiconductor substrate transfer from machine to machine to perform the various operations. A device that will accomplish the improved cleaning method while utilizing less space in the clean room is also needed. It would also be advantageous to more efficiently clean semiconductor substrates after an abrasive process.

More particularly, there is a need for an integrated tool that uses brush scrubbing of an exposed polysilicon and silicon dioxide surface on a semiconductor substrate to remove therefrom silicon dioxide particles remaining from the slurry of an CMP process, followed by an operation within the same integrated tool that cleans the exposed polysilicon and silicon dioxide surface and achieves a final dry state thereof without creating water spots or oxidation of the exposed polysilicon surface.

SUMMARY OF THE INVENTION

The present invention includes a method for cleaning a semiconductor substrate, where a hydrophilic material on the semiconductor substrate is removed to expose an interface with a hydrophobic material. The hydrophobic material is oxidized while brush scrubbing the interface, after which the semiconductor substrate is moved away from the brush scrubbing into a gaseous ambient, and then into a cleaning bath. During the move, the hydrophilic and hydrophobic materials are unaffected. The oxide is removed from the hydrophobic material in the bath, and the location of the semiconductor substrate is changed to a gaseous ambient, and then to a dryer, where the hydrophilic and hydrophobic materials are unaffected during the change of location. The hydrophilic and hydrophobic materials are dried in the dryer without oxidizing the hydrophobic material. It is preferable that, during both the moving and the change the location, the ambient humidity, the ambient temperature, the ambient particle contamination, and the chemistry on the hydrophilic and hydrophobic materials are constant. Also, it is preferable that the hydrophilic material is silicon dioxide, and that the hydrophobic material is polysilicon.

In another embodiment, the inventive method uses an integrated cleaner with scrubber for cleaning and scrubbing semiconductor substrates. The integrated cleaner with scrubber includes a housing, a cleaning module, and a scrubbing module. The cleaning module is disposed within the housing. The cleaning module is capable of performing a cleaning process on a batch of the semiconductor substrates. The cleaning module comprises a cleaning tank, drain means for emptying the cleaning tank of a cleaning media, and supply means for providing the cleaning media. The cleaning module can also include a megasonic device associated with the cleaning tank.

The scrubbing module is also disposed within the housing. Either before or after processing takes place in the scrubbing module, one or more of the semiconductor substrates in the batch can be moved out of contact with the cleaning media in the cleaning module and into a gaseous ambient. Then, the one or more semiconductor substrates be moved to the scrubber module. The surface on each of the semiconductor substrates will be unaffected during the transportation thereof.

The scrubbing module is capable of performing a scrubbing process on one or more semiconductor substrates. The scrubbing module comprises a plurality of scrubbers and drive means for supplying power to the scrubbers. The integrated cleaner with scrubber also comprises a material handling means for removing a batch of semiconductor substrates from the cleaning module and for loading the semiconductor substrates individually into the scrubbing module without removing the semiconductor substrates from the housing of the integrated cleaner with scrubber. An optional drying device may also be integrated into the integrated cleaner with scrubber. The drying device drys the semiconductor substrates after the scrubbing process.

One embodiment of the inventive process uses an integrated tool having therein a brush scrubbing machine that is used on an exposed polysilicon and silicon dioxide interface to remove major silicon dioxide particles that remain upon the interface due to the slurry from a prior CMP operation that was used to expose the interface. In this embodiment, a wet cleaning process is performed upon the interface within the same integrated tool. The wet clean can use solutions of hydrofluoric acid (HF), HF with tetramethylammonium hydroxide (TMAH), or a buffered oxide etch. The wet cleaning process etches any remaining silica slurry particles while removing any native oxide from exposed polysilicon surface on the interface.

Finally, a drying process is conducted within the same integrated tool so as to achieve a final dry state of the exposed interface without creating water spots or oxidation of the exposed polysilicon surface on the interface and so preserve the surface states of mixed polysilicon and silicon dioxide exposed surfaces. The drying process can be a Marangoni-effect aqueous rinsing/drying process or an isopropyl alcohol (IPA) drying process.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
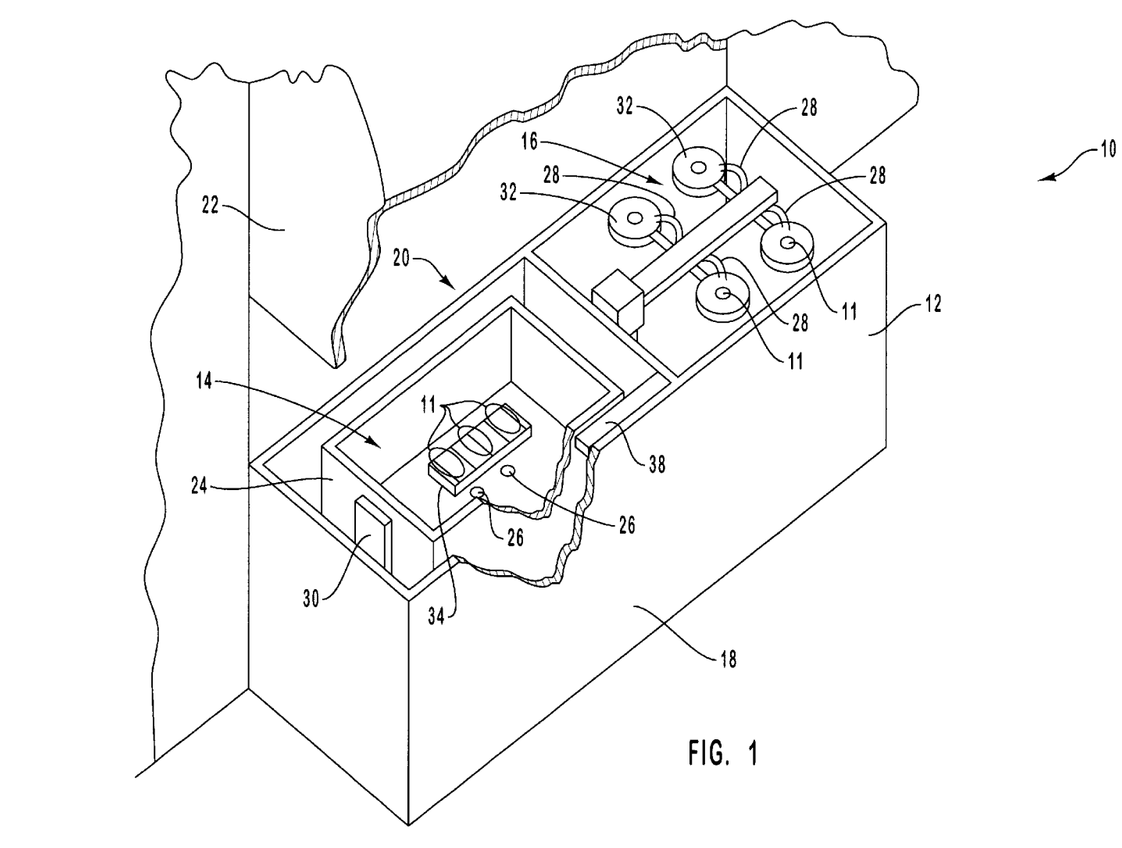
FIG. 1 is a partial breakaway perspective view of one embodiment of an integrated cleaner with scrubber in a clean room environment.

FIG. 1 depicts an integrated cleaner with scrubber 10 in a clean room environment. Integrated cleaner with scrubber 10 comprises a housing 12, a cleaning module 14, and a scrubbing module 16. The embodiment of integrated cleaner with scrubber 10 as illustrated in FIG. 1 is shown by way of example and not limitation. Cleaning module 14 and scrubbing module 16 can be arranged linearly, in a circle, in a square, or in any other configuration depending on the shape of the clean room and the most efficient use of the floor space thereof.

Housing 12 has a front side 18 and a back side 20. Back side 20 of housing 12 is accessible through a typical plenum space that is used with clean rooms. The plenum space enables machines, such as integrated cleaner with scrubber 10, to be maintained without violating or compromising the sterility of the clean room environment. Front side 18 of integrated cleaner with scrubber 10 faces the production bay and is accessible to clean room workers. Housing 12 encloses cleaning module 14 and scrubbing module 16. Housing 12 maintains a clean room atmosphere around cleaning module 14 and scrubbing module 16. The environment within housing 12 must be controlled between cleaning module 14 and scrubbing module 16 with respect to the surface chemistry upon semiconductor substrates, the ambient humidity, the temperature, and the ambient particle contamination.

Housing 12 includes an automatic hood 22 for ventilation and safety purposes. A semiconductor substrate 11 is loaded and unloaded into integrated cleaner with scrubber 10 from front side 18 of housing 12. By way of example, semiconductor substrate 11 can be a silicon wafer. Semiconductor substrate 11 undergoes a cleaning process after the completion of a polishing process, such as a CMP process. The term "cleaning process" is meant to encompass a wet-cleaning process and a dry cleaning process. The term "cleaning process" also is intended to encompass an etching process which actually removes a portion of semiconductor substrate 11. The cleaning module of the inventive integrated cleaner with scrubber can be designed to function in the processes of dry and wet cleaning, and dry and wet etching.

Cleaning module 14 of integrated cleaner with scrubber 10 is illustrated in FIG. 1 as being configured for a wet-cleaning process or a wet etching process. The chemistry of the media or solution used in the cleaning process is preferably selected to remove undesirable materials and contaminants from the surface of semiconductor substrates, such as polishing residue that remains after a CMP process. In the embodiment illustrated in FIG. 1, cleaning module 14 comprises a cleaning tank 24. Cleaning tank 24 can be configured with multiple tanks, where one or more tanks are used as cleaning tanks, and one more tanks are used as rinse tanks.

Figure 2:
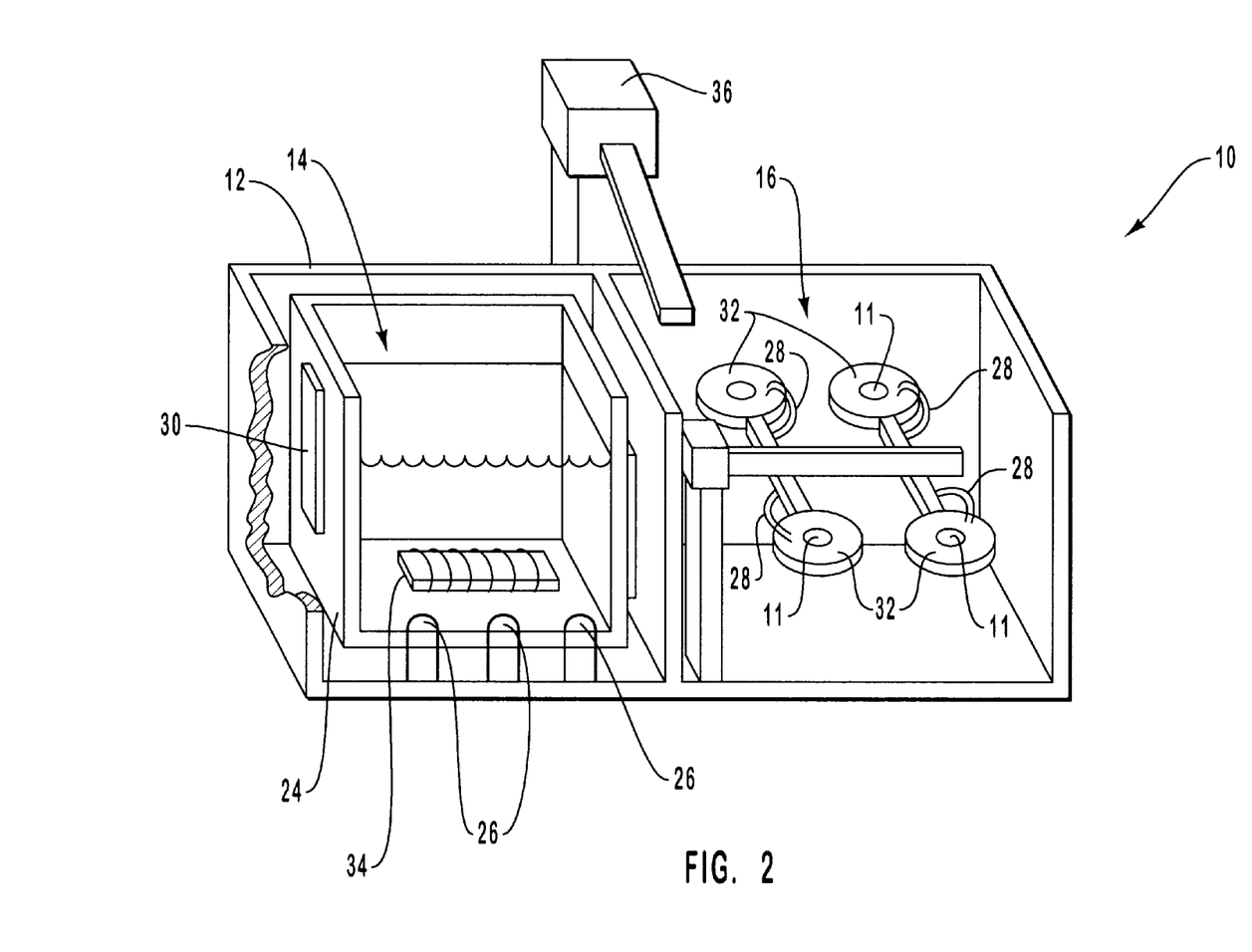
FIG. 2 is another partial breakaway perspective view of the integrated cleaner with scrubber seen in FIG. 1.

As shown in FIG. 2, cleaning tank 24 includes drains 26 that function as valves that allow cleaning tank 24 to drain upon demand. Cleaning tank 24 is connected to a supply means for providing cleaning solution or media to cleaning tank 24. The supply means is attached to various fluid sources such as deionized water and/or chemical solutions. Multiple types of cleaning medias or solutions can be used consecutively in tank 24. For example, a first type of media or solution is used. Next, cleaning tank 24 is drained and refilled with a second type of chemical cleaning solution or media while semiconductor substrates 11 remain in cleaning tank 24. The number of solutions or times cleaning tank 24 is filled and drained is dependent on the process and the composition of the material being removed from semiconductor substrates 11. Once the cleaning process has been completed, cleaning tank 24 may then be filled with deionized water or buffered solution so semiconductor substrates 11 can remain stationary and unchanged until they are individually loaded into scrubbing module 16.

The cleaning process occurring in cleaning module 14 is a batch process in which several semiconductor substrates 11 are simultaneously subjected to the cleaning process. A cassette 34, seen in FIG. 2, holds semiconductor substrates 11 in a parallel and spaced apart relationship one to another such that the surfaces of semiconductor substrate 11 are accessible to the chemical cleaning media and deionized water.

An optional feature of cleaning module 14 is a megasonic weight 30 attached to the outside of cleaning tank 24. Megasonics can be used in conjunction with the cleaning solution to increase the speed and thoroughness of the cleaning process.

Integrated cleaner with scrubber 10 also comprises scrubbing module 16 disposed within housing 12. Scrubbing module 16, which is depicted as a brush or scrubber box, comprises scrubbers 32 and drive means for supplying power to scrubbers 32. As illustrated in FIGS. 1 and 2, scrubbers 32 comprise brush scrubbers. Other types of scrubbers may be used in scrubbing module 16 and be equally effective in performing the function thereof. One embodiment of brush scrubbers 32 comprises roller brush scrubbers. Brush scrubbers 32 may be arranged in various arrangements. In one embodiment of scrubbing module 16 illustrated in FIGS. 1 and 2, brush scrubbers 32 have a parallel arrangement. Each brush scrubber 32 simultaneously scrubs both sides of one semiconductor substrate 11 at a time. As such, FIGS. 1 and 2 depict the simultaneous scrubbing of four (4) semiconductor substrates by the four (4) brush scrubbers 32 in scrubbing module 16. Since the cleaning module 14 is a batch process, and scrubbing module 16 is an individual unit process, throughput is enhanced by parallel processing of multiple semiconductor substrates in scrubber module 16.

As illustrated in FIGS. 1 and 2, scrubbing module 16 also comprises a fluid supply 28 for providing a fluid to each brush scrubber 32. Utilizing a fluid in combination with brush scrubber 32 increases the scrubbing effectiveness of scrubber module 16.

Semiconductor substrates 11 are first input into integrated cleaner with scrubber 10. An operator can manually place cassette 34 into integrated cleaner with scrubber 10. Alternatively, a material handling means for loading and unloading the semiconductor substrates 11 into or out of integrated cleaner with scrubber 10 can be used. One embodiment of such a material handling means comprises a robot 36. Robot 36 loads semiconductor substrates 11 received from a prior process, such as CMP, into cassette 34. Robot 36 then places cassette 34 into cleaning tank 24 of cleaning module 14 of integrated cleaner with scrubber 10. Alternatively, cassette 34 can be positioned manually within cleaning module 14. A shelf 38, seen in FIG. 1, may be attached to front side 18 of housing 12 and is used as a semiconductor substrate loading and unloading area by robot 36. Various other configurations and methods of loading and unloading semiconductor substrates 11 may be utilized and are equally effective in carrying out the intended function thereof.

Cleaning tank 24 is then filled with a cleaning solution. Cleaning tank 24 may be emptied and refilled several times. In addition, cleaning tank 24 may be filled with deionized water or buffered solution for cassette 34 of semiconductor substrates 11 to remain in if scrubber module 16 is not ready to be loaded with semiconductor substrates 11. Upon completion of the cleaning process in cleaning module 14, a material handling means, such as robot 36, removes cassette 32 from cleaning tank 24 of cleaning module 16.

After semiconductor substrates 11 in cassette 34 are cleaned in cleaning module 14, semiconductor substrates 11 must be unloaded individually from cassette 34 and then loaded into scrubber module 16. A second material handling means can be used or the first material handling means, such as robot 36, can be utilized. The use of a second material handling means depends on space, configuration of the integrated cleaner with scrubber, and throughput as well as the configuration and programming of the first material handling means, such as robot 36. By way of example and illustration, both the first and second material handling means can be robot 36.

Each semiconductor substrate 11 is placed in a respective scrubber 32 in scrubbing module 16 and the scrubbing process proceeds until completion. After the scrubbing process for each semiconductor substrate 11 in a respective cassette 34 is complete, a material handling means, such as robot 36, takes the individual semiconductor substrate 11 out of the respective scrubber 32 and also out of scrubbing module 16, and then puts the individual semiconductor substrate 11 into another or the same cassette 34. Successive semiconductor substrates 11 are processed in scrubber module 16 until all of the semiconductor substrates 11 in cassette 34 have been scrubbed in scrubber module 16. Shelf 38, as illustrated in FIG. 1, may be attached to housing 12 as a loading and unloading area for semiconductor substrates 11. Cassette 34 of semiconductor substrates 11 can then be placed into a wet receive tank separate from integrated cleaner with scrubber 10.

FIGS. 1 and 2 show cleaning module 14 and scrubbing module 16 without other modules intervening therebetween for processing semiconductor substrates 11. Other ocesses can be made to intervene such as an aerosol clean, a $CO_2$ snow gun clean, a high pressure deionized water clean, or another physical cleaning process. The intervening processes between cleaning module 14 and scrubber module 16 can process semiconductor substrates 11 in either a batch or individual unit process and can also be wholly contained within housing 12.

Figure 3:
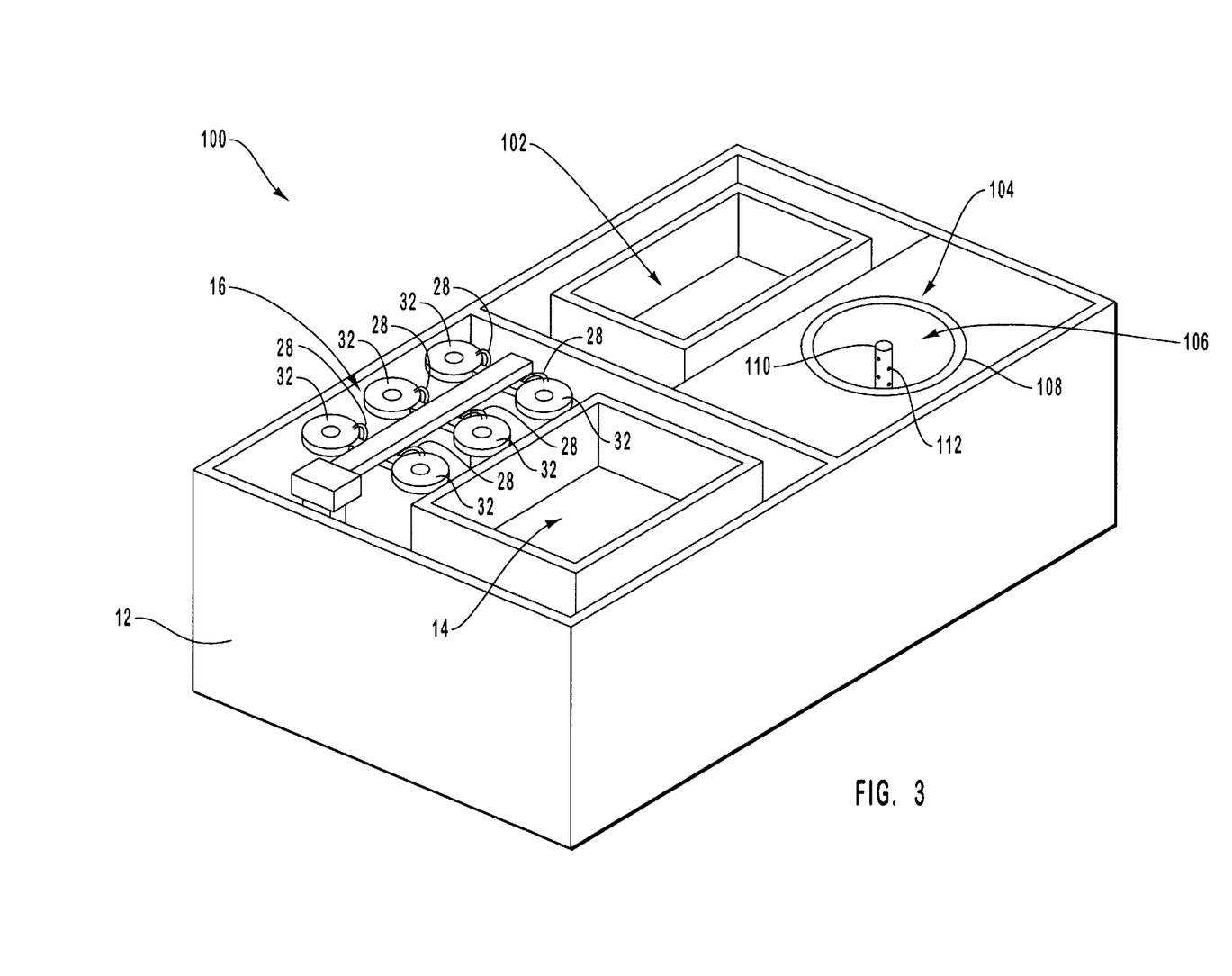
FIG. 3 is a perspective elevation view of a second embodiment at the integrated cleaner with scrubber having also integrated therewith a device for drying semiconductor substrates.

A second embodiment of integrated cleaner with scrubber 100 is shown in FIG. 3. In this embodiment, integrated cleaner with scrubber 100 has two additional modules incorporated therein. The majority of the features previously discussed apply to the second embodiment of integrated cleaner with scrubber 100. The features that are not affected are identified with the same reference numbers as used in FIGS. 1 and 2. Only those features that have changed will be described in detail.

Typically, cassette 34 containing semiconductor substrates 11 is placed into a wet receive tank upon completion of the scrubber process. In addition, a spin dry or vacuum dry process can be performed after completing the scrubbing process. The embodiment of integrated cleaner with scrubber 100 shown in FIG. 3 not only includes cleaning module 14 and scrubbing module 16, but also includes a wet receive tank 102 and a drying module 104.

The modules making up integrated cleaner with scrubber 100 are arranged in a square pattern as illustrated in FIG. 3. Processing through integrated cleaner with scrubber 100 follows a generally U-shaped pattern. Semiconductor substrates 11 progress incrementally through cleaning module 14, scrubber module 16, wet receive tank 102, and drying module 104. Other configurations of the physical layout of the modules comprising integrated cleaner with scrubber 10 are also contemplated, and can also include the intervening processing modules described above with respect to the first embodiment.

Wet receive tank 102 is disposed within housing 12 adjacent to scrubber module 16. Wet receive tank 102 is filled with deionized water to rinse semiconductor substrate 11. Wet receive tank 102 is intended to be used in a batch process. After semiconductor substrates 11 have been reloaded into cassette 34 after the scrubbing process in scrubbing module 16, cassette 34 is placed by robot 36 into wet receiving tank 102. Various configurations of wet receive tank 102 are equally effective in carrying out the intended function thereof. In FIG. 3, wet receive tank 102 is illustrated as a single tank. It is, however, possible to use various other configurations of wet receive tank 102 such as continual rinse and multiple tanks.

Integrated cleaner with scrubber 100 also comprises drying module 104. Drying module 104 may have several configurations that are equally effective in carrying out the intended function thereof, such as a conventional Marangoni dryer or isopropyl alcohol vapor dryer. In the embodiment illustrated in FIG. 3, drying module 104 comprises a conventional spin-rinse dryer 106. Spin-rinse dryer 106 comprises a centrifuge like drum 108. Drum 108 has a pipe 110 in the center thereof. Pipe 110 has holes 112 formed therein and is connected to a source of deionized water and hot nitrogen. In the embodiment of drying module 104 illustrated in FIG. 3, spin-rinse dryer 106 is intended to be used in a batch process.

In use, cleaning module 14 and scrubbing module 16 operate as previously discussed relative to integrated cleaner with scrubber 10. Once the scrubbing process in scrubbing module 16 has been completed, material handling means, such as robot 36, takes the individual semiconductor substrates 11 out of scrubber module 16 and puts them into cassette 34. Wet receive tank 102 is intended to be used in a batch process. Therefore, cassette 34 containing semiconductor substrates 11 is placed into a wet receive tank 102 of integrated cleaner with scrubber 100 by material handling means, such as robot 36.

Cassette 34 is then removed from wet receive tank 102 and placed in drying module 106 by a material handling means, such as robot 36. Semiconductor substrates 11 within cassette 34 are dried in drying module 104. In the embodiment illustrated in FIG. 3, drying module 104 comprises spin-rinse dryer 106. Upon completion of the drying in drying module 104, cassette 34 is removed from drying module 34 by material handling means, such as robot 36. Further material handling of semiconductor substrates 11 is dependent on whether the subsequent process is a batch process or a singular process.

An advantage of the first and second embodiments of integrated cleaner with scrubber 10, 100 is the conservation of floor space in the clean room. Also, the static condition of the surface chemistry of semiconductor substrates 11, as well as the ambient humidity, the ambient temperature, and the ambient particle contamination tends to stabile the fabrication process and so increase yield. Further, the integrated nature of the inventive machine and process increases the efficiency and throughput.

Figure 4:
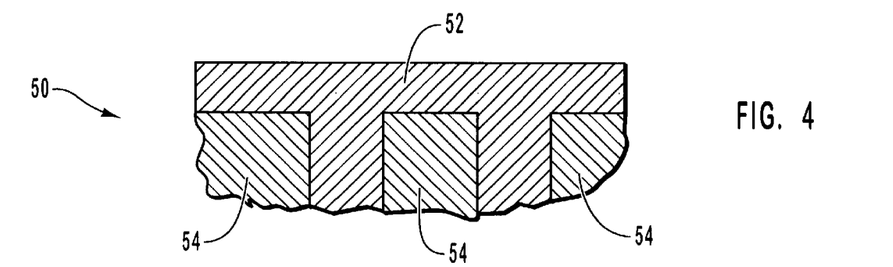
FIG. 4 is a cross sectional elevation view of a semiconductor substrate having thereon polysilicon deposited over silicon dioxide, which semiconductor substrate is intended to be situated within the integrated cleaner with scrubber disclosed herein for the purpose of brush scrubbing, cleaning, and drying the same.

Use of the embodiments of the machines depicted in FIGS. 1–3 will now be described with respect to the processing therethrough of a semiconductor substrate, such as semiconductor substrates 11 in cassette 34. This processing will be described in conjunction with a description of FIGS. 4 through 8. FIG. 4 shows a semiconductor substrate 50 having thereon polysilicon 52 deposited over a patterned silicon dioxide 54. It is intended that semiconductor substrate 50 is situated within the integrated cleaner with scrubber as described above in conjunction with FIGS. 1–3.

A CMP process is conducted upon semiconductor substrate 50 so as to form a planar surface thereon. The planar surface has co-planar surface thereon composed of polysilicon and silicon dioxide. FIG. 5 shows isolated polysilicon segments 56 and isolated silicon dioxide segments 58, each having a top surface co-planar to other top surfaces. The CMP process renders an interface of polysilicon and silicon dioxide having silicon dioxide slurry particles 55 thereon.

Figure 6:
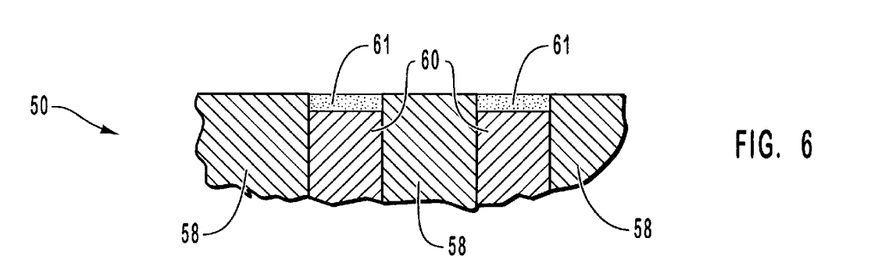
FIG. 6 is a view of FIG. 5 after a brush scrubbing operation that removes most of the slurry particles but oxidizes the exposed polysilicon.

FIG. 6 shows the results of a brush scrubbing operation that is performed in the integrated cleaner with scrubber machine. The brush scrubbing operation removes most of the slurry particles but consumes some of each isolated silicon dioxide segment 58 seen in FIG. 5. The result of the brush scrubbing operation in the integrated cleaner with scrubber is an oxide 61 formed upon each exposed surface of polysilicon segments 60 seen in FIG. 6. It is preferable that the brush scrubbing operation be performed in a high-pH solution. Such a solution can be dilute ammonia, or ammonium hydroxide with peroxide, or ammonium hydroxide with TMAH. The brush scrubbing operation in the high-pH solution causes the hydrophilic polysilicon segment 60 to become partially oxidized. The oxidation is a result of a high-pH environment cleaning operation. Here, HF is preferred in that it etches the polishing slurry silica particles as well as dispersing and dissolving the same.

After the brush scrubbing operation in the high-pH environment, a deionized water rinse situated within the same integrated cleaner with scrubber machine is performed. This rinse serves to avoid a chemical reaction between the solutions used in the brush scrubbing operation and those used in any subsequent operation.

Within the same integrated cleaner with scrubber machine, a cleaning operation is performed after the brush scrubbing operation following the deionized water rinse. The cleaning operation can be aided megasonically by dispersing and separating slurry particles 55 from semiconductor substrate 50. The cleaning operation removes each oxide 61 upon each exposed surface of polysilicon segment 60 as well as removing any remaining silicon dioxide slurry particles 55. The cleaning operation uses a cleaning solution that remains upon the exposed surface of semiconductor substrate 50. The cleaning operation can use a cleaning solution that can be hydrofluoric acid (100 to 1 ratio by volume), or a buffered oxide etchant (BOE) such as buffered ammonium fluoride/hydrofluoric acid, or hydrofluoric acid/tetramethylammonium hydroxide (TMAH). As seen in FIG. 7, cleaning solution droplets 62, 64 remain, respectively, upon hydrophilic silicon dioxide segments 58 and hydrophobic polysilicon segments 60. The hydrophilicity of silicon dioxide causes cleaning solution droplets 62 to spread out over silicon dioxide segments 58. The hydrophobicity of polysilicon causes cleaning solution droplets 64 to bead up without spreading out over polysilicon segments 60. As such, cleaning solution droplets 62 wet silicon dioxide segments 58 and cleaning solution droplets 64 do not wet polysilicon segments 60. This cleaning operation etches or dissolves any remaining residual silica particles left over from the CMP slurry, as well as removing small amounts of silicon dioxide film from the silicon dioxide interface. Also, this final operation decapitates or otherwise removes the oxidized portion of the hydrophobic polysilicon. As such, polysilicon is exposed and the oxidation thereof is removed.

Preferably, the integrated cleaner with scrubber machine has a drying machine therein for performing a drying operation upon the semiconductor substrate. It is also preferable that a drying process is the last step that is performed within the integrated cleaner with scrubber machine. The drying machine can be a Marangoni-type dryer that performs a Marangoni-effect aqueous rinsing/drying. The drying machine can also be an IPA dryer. Importantly, the drying process is used to preserve the states of the exposed surfaces of polysilicon and silicon dioxide. As such, cleaning solutions are removed from the semiconductor substrate without creating water spots or oxidation of the exposed polysilicon surface.

Figure 8:
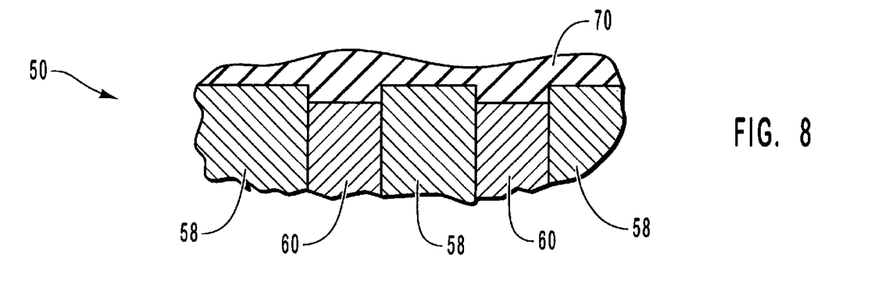
FIG. 8 is a view of FIG. 7 after a drying operation that removes the cleaning solution without oxidizing the exposed polysilicon surface.

As seen in FIG. 8, neither water spots nor oxidation art situated upon the exposed surface of polysilicon segments 60. An electrically-conductive layer 70 has been formed over semiconductor substrate 50 and upon the exposed surface of each polysilicon segment 60. An example of such an electrically-conductive layer is a metallization line, an electrode, a cell plate, or a word line.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for cleaning a surface on a semiconductor substrate, the method comprising:
   removing a hydrophilic material from a semiconductor substrate to expose an interface with a hydrophobic material;
   oxidizing the hydrophobic material while brush scrubbing the interface;
   moving the semiconductor substrate away from said brush scrubbing, into a gaseous ambient, and then into a cleaning bath, said hydrophilic and hydrophobic materials having chemical properties and being unaffected during said moving while the semiconductor substrate is exposed to an ambient humidity, an ambient temperature, and an ambient particle contamination;
   removing, within the cleaning bath, the oxide from the hydrophobic material;
   moving the semiconductor substrate from the cleaning bath, into a gaseous ambient, and then into a dryer, said hydrophilic and hydrophobic materials being unaffected during said moving from the cleaning bath; and
   drying, in the dryer, the hydrophilic and hydrophobic materials without oxidizing the hydrophobic material.

2. The method as defined in claim 1, wherein:
   the ambient humidity, the ambient temperature, the ambient particle contamination on, and the chemical properties of the hydrophilic and hydrophobic materials are constant during both said moving from said brush scrubbing and said moving from the cleaning bath;
   the hydrophilic material is silicon dioxide; and
   the hydrophobic material is polysilicon.

3. A method for cleaning a semiconductor substrate, said method comprising:
   simultaneously contacting a surface on each of a plurality of semiconductor substrates with a liquid non-abrasively, each surface on each said semiconductor substrate having an interface of polysilicon and silicon oxide;
   transporting one of said plurality of semiconductor substrates out of contact with said liquid, into a gaseous ambient, and then into a scrubber, wherein the surface on said one of said plurality of semiconductor substrates is unaffected during the transportation thereof and while said one of said plurality of semiconductor substrates is exposed to an ambient humidity, an ambient, temperature, an ambient particle contamination, and the surface on said one of said plurality of semiconductor substrates has chemical properties; and
   forming, adjacent to said interface of polysilicon and silicon oxide, an oxide from the polysilicon while applying an abrasive force to the surface of said one of said plurality of semiconductor substrates with said scrubber.

4. The method as defined in claim 3, further comprising:
   moving one of said plurality of semiconductor substrates out of the scrubber, into a gaseous ambient, and then into a cleaning module, where the surface on said one of said plurality of semiconductor substrates is unaffected during the movement thereof;
   removing, within the cleaning module, the oxide from the polysilicon on the surface of said one of said plurality of semiconductor substrates;
   moving one of said plurality of semiconductor substrates out of the cleaning module, into a gaseous ambient, and then into a drying module, where the surface on said one of said plurality of semiconductor substrates is unaffected during said change of location; and
   drying, in the drying module, the surface of said one of said plurality of semiconductor substrates without oxidizing the polysilicon thereof.

5. The method as defined in claim 4, wherein removing, within the cleaning module, the oxide from the polysilicon on the surface of said one of said plurality of semiconductor substrates is performed using a cleaning solution selected from the group consisting of hydrofluoric acid, a solution of ammonium fluoride and hydrofluoric acid, and a solution of hydrofluoric acid and tetramethylammonium hydroxide.

6. The method as defined in claim 4, wherein said drying is a process selected from the group consisting of a Marangoni dryer process and an IPA dryer process.

7. The method as defined in claim 4, further comprising, after said drying:
   forming an electrically conductive material upon the polysilicon on the surface of said one of said plurality of semiconductor substrates.

8. The method as defined in claim 3, wherein during the transporting of said one of said plurality of semiconductor substrates out of contact with said liquid, into said gaseous ambient, and then into said scrubber, the ambient humidity, the ambient temperature, the ambient particle contamination on, and the chemical properties of the surface on said one of said plurality of semiconductor substrates are substantially the same.

9. The method as defined in claim 3, wherein said liquid has a chemical effect upon the surface on each of said plurality of semiconductor substrates.

10. The method as defined in claim 3, wherein said liquid simultaneously removes material non-abrasively from said surface on each of said plurality of semiconductor substrates.

11. The method as defined in claim 3, wherein the liquid is an etchant to material on said plurality of semiconductor substrates.

12. The method as defined in claim 3, wherein the liquid is applied to said plurality of semiconductor substrates in a wet clean tank.

13. The method as defined in claim 3, further comprising:
   a deionized rinse of said one of said plurality of semiconductor substrates after applying said abrasive force to the surface of said one of said plurality of semiconductor substrates with said scrubber.

14. A method for cleaning a semiconductor substrate, said method comprising:
   simultaneously removing material non-abrasively from a surface on each of a plurality of semiconductor substrates situated within a housing in a clean room environment, said surface on each said semiconductor substrate having an interface of polysilicon and silicon oxide;
   transporting one of said plurality of semiconductor substrates to a scrubber situated within said housing in said clean room environment, wherein the surface on said one of said plurality of semiconductor substrates is unaffected during the transportation thereof, and while one of said plurality of semiconductor substrates is exposed to an ambient humidity, an ambient temperature, an ambient particle contamination and the surface on said one of said plurality of semiconductor substrates has chemical properties; and forming an oxide on the polysilicon of the interface while removing material abrasively from the surface of said one of said plurality of semiconductor substrates with said scrubber situated within said housing in said clean room environment.

15. The method as defined in claim 14, further comprising:

moving one of said plurality of semiconductor substrates out of the scrubber, into a gaseous ambient within said housing in said clean room environment, and then into a cleaning module within said housing in said clean room environment, where the surface on said one of said plurality of semiconductor substrates is unaffected during the movement thereof;

removing, within the cleaning module, the oxide from the polysilicon on the surface of said one of said plurality of semiconductor substrates;

moving one of said plurality of semiconductor substrates out of the cleaning module, into a gaseous ambient within said housing in said clean room environment, and then into a drying module within said housing in said clean room environment, where the surface on said one of said plurality of semiconductor substrates is unaffected during said change of location; and drying, in the drying module, the surface of said one of said plurality of semiconductor substrates without oxidizing the polysilicon thereof.

16. The method as defined in claim 15, wherein removing the oxide from the polysilicon on the surface is performed using a cleaning solution selected from the group consisting of hydrofluoric acid, a solution of ammonium fluoride and hydrofluoric acid, and a solution of hydrofluoric acid and tetramethylammonium hydroxide.

17. The method as defined in claim 15, wherein said drying is a process selected from the group consisting of a Marangoni dryer process and an IPA dryer process.

18. The method as defined in claim 15, further comprising, after said drying:

forming an electrically conductive material upon the polysilicon on the surface of said one of said plurality of semiconductor substrates.

19. The method as defined in claim 14, further comprising:

a deionized rinse of said one of said plurality of semiconductor substrates after removing material abrasively from the surface of said one of said plurality of semiconductor substrates with said scrubber situated within said housing in said clean room environment.

20. The method as defined in claim 14, wherein simultaneously removing material non-abrasively from said surface on each of said plurality of semiconductor substrates is conducted within said housing in said clean room environment with a chemical that is applied non-abrasively simultaneously to said surface on each of said plurality of semiconductor substrates.

21. The method as defined in claim 20, wherein the chemical applied non-abrasively to said surface on each of said plurality of semiconductor substrates is an etchant to said material on said plurality of semiconductor substrates.

22. The method as defined in claim 20, wherein the chemical applied non-abrasively to said surface on each of said plurality of semiconductor substrates is applied to said plurality of semiconductor substrates in a wet clean tank in which said plurality of semiconductor substrates are substantially submerged in the chemical.

23. The method as defined in claim 14, wherein said scrubber situated within said housing in said clean room environment scrubs one of said semiconductor substrates at a time.

24. The method as defined in claim 14, wherein said housing further comprises a plurality of said scrubbers that scrubs one of said semiconductor substrates at a time.

25. The method as defined in claim 14, wherein during the transporting of said one of said plurality of semiconductor substrates from said simultaneous removal of material to said scrubber, the ambient humidity, the ambient temperature, the ambient particle contamination on, and the chemical properties of the surface said one of said plurality of semiconductor substrates are substantially the same.

26. The method as defined in claim 14, wherein:

simultaneously removing material non-abrasively from a surface on each of a plurality of semiconductor substrates situated within a housing in a clean room environment includes simultaneously contacting said surface on each of said plurality of semiconductor substrates with a liquid; and transporting one of said plurality of semiconductor substrates to a scrubber situated within said housing in said clean room environment includes transporting said one of said plurality of semiconductor substrates out of contact with said liquid into a gaseous ambient, and then into said scrubber.

27. The method as defined in claim 26, further comprising:

repeating for each semiconductor substrate in said plurality of semiconductor substrates said transporting one of said plurality of semiconductor substrates out of contact with said liquid, into a gaseous ambient, and then into said scrubber.

28. A method for cleaning and scrubbing semiconductor substrates, said method comprising:

loading a batch of the semiconductor substrates into a cleaning module within an integrated cleaner with scrubber, said integrated cleaner with scrubber being situated in a clean room environment, and said batch comprising a plurality of the semiconductor substrates each having a surface thereon with an interface of polysilicon and silicon oxide;

cleaning said batch of the semiconductor substrates in said cleaning module;

removing said batch of the semiconductor substrates from said cleaning module without exiting said integrated cleaner with scrubber, while said batch of the semiconductor substrates is exposed to an ambient humidity, an ambient temperature, an ambient particle contamination, and the surfaces of the semiconductor substrates in said batch have chemical properties;

loading the semiconductor substrates into a scrubber module within said integrated cleaner with scrubber without having removed the semiconductor substrates from said integrated cleaner with scrubber, the semiconductor substrates being singularly positioned within said scrubber module;

forming an oxide on the polysilicon of said interface on each said surface while scrubbing each said semiconductor substrate in said scrubbing module singularly, removing the semiconductor substrates from said scrubbing module of said integrated cleaner with scrubber and loading the semiconductor substrates into the cleaning module within said integrated cleaner with scrubber without having removed the semiconductor substrates from said integrated cleaner with scrubber, the semiconductor substrates being singularly positioned within said scrubber module;

removing, within the cleaning module, the oxide from the polysilicon of the interface on the surface of each of the semiconductor substrates and loading the semiconductor substrates into a drying module without having removed the semiconductor substrates from said integrated cleaner with scrubber, the semiconductor substrates being singularly positioned within said scrubber module; and drying, in the drying module, the semiconductor substrates without oxidizing the polysilicon of the interface on the surface of each of the semiconductor substrates.

29. The method as defined in claim 28, wherein removing the oxide from the polysilicon of the interface on the surface of each of the semiconductor substrates is performed using a cleaning solution selected from the group consisting of hydrofluoric acid, a solution of ammonium fluoride and hydrofluoric acid, and a solution of hydrofluoric acid and tetramethylammonium hydroxide.

30. The method as defined in claim 28, wherein said drying is a process selected from the group consisting of a Marangoni dryer process and an IPA dryer process.

31. The method as defined in claim 28, further comprising, after said drying:

forming an electrically conductive material upon the polysilicon of the interface in the surface of each of the semiconductor substrates.

32. The method as defined in claim 28, further comprising:

a deionized rinse of said one of said plurality of semiconductor substrates after scrubbing each said semiconductor substrate in said scrubbing module singularly.

33. A method as recited in claim 28, wherein prior to loading said batch of the semiconductor substrates into said cleaning module, the semiconductor substrates are individually loaded into a cassette to hold said batch of the semiconductor substrates.

34. A method as recited in claim 33, wherein the semiconductor substrates are individually loaded into said cassette by a material handling means for moving the semiconductor substrates.

35. The method as defined in claim 28, wherein:

cleaning said batch of the semiconductor substrates in said cleaning module includes simultaneously contacting said surface on each of said plurality of semiconductor substrates with a liquid;

removing said batch of the semiconductor substrates from said cleaning module without exiting said integrated cleaner with scrubber includes transporting said one of said plurality of semiconductor substrates out of contact with said liquid and into a gaseous ambient; and loading the semiconductor substrates into said scrubber module within said integrated cleaner with scrubber without having removed the semiconductor substrates from said integrated cleaner with scrubber includes transporting said one of said plurality of semiconductor substrates from said gaseous ambient into said scrubber.

36. The method as defined in claim 35, further comprising:

for each semiconductor substrate in said batch of the semiconductor substrates, repeating:

the transporting said one of said plurality of semiconductor substrates out of contact with said liquid and into said gaseous ambient; and the transporting said one of said plurality of semiconductor substrates from said gaseous ambient into said scrubber module.

37. A method as recited in claim 28, wherein the semiconductor substrates are unloaded individually from said scrubbing module by material handling means for moving the semiconductor substrates.

38. A method as recited in claim 28, wherein cleaning said batch of the semiconductor substrates in said cleaning module is a wet-cleaning process.

39. A method as recited in claim 28, wherein cleaning said batch of the semiconductor substrates in said cleaning module is an etch.

40. A method as recited in claim 28, wherein cleaning said batch of the semiconductor substrates in said cleaning module is a dry cleaning process.

41. A method as recited in claim 28, wherein said cleaning module comprises a cleaning tank, a drain for emptying said cleaning tank; and a supply to provide a cleaning media; and wherein cleaning said batch of the semiconductor substrates in said cleaning module comprises:

loading chemistry into said cleaning tank in said cleaning module;

filling said cleaning tank with said cleaning media;

processing said batch of the semiconductor substrates; and draining said cleaning tank.

42. A method as recited in claim 41, wherein cleaning said batch of the semiconductor substrates in said cleaning module is repeated using a different cleaning media without removing said batch of the semiconductor substrates from said cleaning module.

43. A method as recited in claim 41, wherein said cleaning module further comprises a megasonic device associated with said cleaning tank.

44. A method as recited in claim 28, wherein said scrubber module comprises:

a plurality of brush scrubbers;

drive means for supplying power to said scrubbers; and fluid supply means for providing liquid to each of said plurality of brush scrubbers.

45. A method as defined in claim 28, wherein between removing said batch of the semiconductor substrates from said cleaning module and loading the semiconductor substrates into the scrubber module, the surfaces on each removed one of said semiconductor substrates in said batch is unaffected.

46. The method as defined in claim 45, wherein between removing said batch of the semiconductor substrates from said cleaning module and loading the semiconductor substrates into the scrubber module, the ambient humidity, the ambient temperature, the ambient particle contamination on, and the chemical properties of the surfaces of each removed one of said semiconductor substrates in said batch is substantially the same.

47. A method for cleaning and scrubbing semiconductor substrates, said method comprising:

preparing a batch of the semiconductor substrates by loading the semiconductor substrates into a holder to hold the semiconductor substrates, said batch comprising a plurality of the semiconductor substrates;

loading said batch of the semiconductor substrates into a cleaning module within an integrated cleaner with scrubber, said integrated cleaner with scrubber being situated in a clean room environment, and said cleaning module comprising:
 a cleaning tank;
 a drain for emptying said cleaning tank; and
 a supply to provide a cleaning solution;

wet-cleaning said batch of the semiconductor substrates in said cleaning module, said wet-cleaning comprising:
 loading said batch into said cleaning tank;
 filling said cleaning tank with said cleaning solution;
 processing said batch of said the semiconductor substrates; and
 draining said cleaning tank;

removing said batch of the semiconductor substrates from said cleaning module without exiting said integrated cleaner with scrubber;

loading the semiconductor substrates into a scrubber module within said integrated cleaner with scrubber without having removed the semiconductor substrates from the integrated cleaner with scrubber, the semiconductor substrates being singularly positioned within said scrubber module, wherein between removing said batch of the semiconductor substrates from said cleaning module and loading the semiconductor substrates into the scrubber module, the surfaces on each removed one of said semiconductor substrates in said batch is unaffected, said scrubber module comprising:
 a plurality of brush scrubbers; and
 drive means for supplying power to said brush scrubbers;

scrubbing the semiconductor substrates in said scrubbing modular singularly, wherein:
 each said semiconductor substrate has a surface thereon with an interface of polysilicon and silicon oxide; and
 an oxide is formed on the polysilicon during said scrubbing;

removing the semiconductor substrates from said scrubbing module of said integrated cleaner with scrubber; and loading the semiconductor substrates into said holder, thereby forming said batch of the semiconductor substrates.

48. The method as defined in claim 47, further comprising:
 placing said batch of the semiconductor substrates into a wet receive tank;
 moving said batch of the semiconductor substrates from said wet receive tank into the cleaning module within said integrated cleaner with scrubber without having removed the semiconductor substrates from said integrated cleaner with scrubber, the semiconductor substrates being singularly positioned within said scrubber module;
 removing, within the cleaning module, the oxide from the polysilicon of the interface on the surface of each of the semiconductor substrates and loading the semiconductor substrates into a drying module without having removed the semiconductor substrates from said integrated cleaner with scrubber, the semiconductor substrates being singularly positioned within said scrubber module; and
 drying, in the drying module, the semiconductor substrates without oxidizing the polysilicon of the interface on the surface of each of the semiconductor substrates, wherein said integrated cleaner with scrubber further comprises said wet receive tank and said drying module.

49. The method as defined in claim 48, wherein removing the oxide from the polysilicon of the interface on the surface of each of the semiconductor substrates is performed using a cleaning solution selected from the group consisting of hydrofluoric acid, a solution of ammonium fluoride and hydrofluoric acid, and a solution of hydrofluoric acid and tetramethylammonium hydroxide.

50. The method as defined in claim 48, wherein said drying is a process selected from the group consisting of a Marangoni dryer process and an IPA dryer process.

51. The method as defined in claim 48, further comprising, after said drying:
 forming an electrically conductive material upon the polysilicon of the interface on the surface of each of the semiconductor substrates.

52. The method as defined in claim 47, further comprising:
 a deionized rinse of said one of said plurality of semiconductor substrates after scrubbing each said semiconductor substrate in said scrubbing module singularly.

* * * * *

UNITED STATES PATENT AND TRADEMARK OFFICE
CERTIFICATE OF CORRECTION

PATENT NO. : 6,358,325 B1
DATED : March 19, 2002
INVENTOR(S) : Michael T. Andreas It is certified that error appears in the above-identified patent and that said Letters Patent is hereby corrected as shown below:

Column 1,
Line 37, after "completed" and before "that" delete "with"

Column 3,
Line 18, change "distanced" to -- distances --
Line 19, after "suggested" change "nor" to -- or --

Column 5,
Line 30, after "removes the" change "residuai" to -- residual --

Column 8,
Line 12, after "Other" change "ocesses" -- processes --

Column 9,
Line 35, after "tends to" change "stabile" to -- stabilize --

Column 10,
Line 59, after "oxidation" change "art" to -- are --

Column 11,
Line 55, change "ambient, temperature" to -- ambient temperature --

Column 15,
Line 33, after "interface" change "in" to -- on --

Signed and Sealed this

Third Day of December, 2002

JAMES E. ROGAN
*Director of the United States Patent and Trademark Office*